US007802986B2

(12) United States Patent
Ooshima et al.

(10) Patent No.: US 7,802,986 B2
(45) Date of Patent: Sep. 28, 2010

(54) THERMAL PROCESSING APPARATUS

(75) Inventors: Kazuhiko Ooshima, Koshi (JP); Shigeki Aoki, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 709 days.

(21) Appl. No.: 11/617,183

(22) Filed: Dec. 28, 2006

(65) Prior Publication Data

US 2007/0166655 A1 Jul. 19, 2007

(30) Foreign Application Priority Data

Jan. 17, 2006 (JP) ............................. 2006-008839

(51) Int. Cl.
*F27D 1/18* (2006.01)
(52) U.S. Cl. .................. 432/250; 432/247; 219/390; 438/715; 438/738
(58) Field of Classification Search ............... 432/120, 432/239, 250, 247; 219/390, 405; 118/724, 118/725, 729; 438/660, 663, 715, 758
See application file for complete search history.

(56) References Cited

U.S. PATENT DOCUMENTS

| 5,441,568 | A | * | 8/1995 | Cho et al. ................. 118/715 |
| 7,515,264 | B2 | * | 4/2009 | Otsuki et al. .............. 356/338 |
| 7,520,957 | B2 | * | 4/2009 | Kao et al. ................ 156/345.43 |
| 2004/0048220 | A1 | * | 3/2004 | Nguyen et al. ............. 432/250 |
| 2007/0071890 | A1 | * | 3/2007 | Yoshihara et al. .......... 427/240 |

FOREIGN PATENT DOCUMENTS

| JP | 2000-124106 | 4/2000 |
| JP | 2003-318091 | 11/2003 |
| JP | 2005-187842 | 7/2005 |
| JP | 2005-538564 | 12/2005 |

* cited by examiner

*Primary Examiner*—Gregory A Wilson
(74) *Attorney, Agent, or Firm*—Oblon, Spivak, McClelland, Maier & Neustadt, L.L.P.

(57) ABSTRACT

A thermal processing apparatus for thermally processing a substrate in a processing chamber includes a heating plate for mounting and thermally processing the substrate thereon, and a lid body covering the heating plate from above to constitute a portion of the processing chamber. The lid body has a ceiling plate and a peripheral side portion vertically provided at a peripheral end portion of the ceiling plate. The ceiling plate is provided with a supply port for supplying a gas into the processing chamber, and a side portion of the ceiling plate is provided with a plurality of exhaust ports for exhausting the gas in the processing chamber. An exhaust pipe communicating with the exhaust ports and having an outlet at a point at equal distances from the exhaust ports is provided to be attachable and detachable to/from the lid body. According to the present invention, the maintenance work against clogging due to the impurities such as a sublimate and the like generated by the thermal processing can be easily performed.

24 Claims, 14 Drawing Sheets

THERMAL PROCESSING APPARATUS

BACKGROUND OF THE INVENTION

1. Field of the Invention

The present invention relates to a thermal processing apparatus and, more specifically, to a thermal processing apparatus for performing heat processing for a substrate, for example, a semiconductor wafer, an LCD glass substrate or the like.

2. Description of the Related Art

Generally, in manufacture of a semiconductor device, the photolithography technology is used to form a thin film of ITO (Indium Tin Oxide) and an electrode pattern on a semiconductor wafer, LCD glass substrate, or the like (hereinafter, referred to as a substrate). In the photolithography technology, a photoresist is applied on the wafer, a resist film formed by the application is exposed to light according to a predetermined circuit pattern, and the exposed pattern is subjected to developing treatment to form a circuit pattern in the resist film.

In the photolithography process, various kinds of heat processing are performed, such as heat processing after the resist application (pre-baking), heat processing after exposure (post exposure-baking), heat processing after developing treatment (post-baking) and so on.

In those kinds of heat processing in the prior art, for example, in the pre-baking, a purge gas, for example, air, a nitrogen gas (N2) or the like is supplied into a processing chamber housing a wafer or the like, and the gas used for the processing is exhausted to the outside via an exhaust pipe connected to the processing chamber. In this event, a small amount of sublimate, for example, an acid generating material contained in the photoresist, such as PAG (Photo Acid Grain) or a foreign substance such as a low molecular resin constituting the resist is generated during the heating from the resist film formed on the front surface of the wafer or the like. In particular, the sublimate is often generated from the photoresist using a nonionic acid generating material with a low boiling point.

Accordingly, in the prior art, an impurity collecting portion for the sublimate and the like is provided along an exhaust line such as the exhaust pipe or the like, and a plurality of current plates for exhaust are provided on the peripheral side portion of the lid body constituting the processing chamber in order to evenly disperse the exhaust in conjunction with the impurity collecting portion (Claims and FIG. 4 of Japanese Patent Application Laid-open No. 2003-318091).

SUMMARY OF THE INVENTION

The technique described in Japanese Patent Application Laid-open No. 2003-318091, however, has problems. One problem is that if a large amount of impurities such as a sublimate and the like is generated, the exhaust pipe is clogged in a short time, and therefore maintenance should be frequently performed. Another problem is that the impurities adhere also to the current plate for exhaust, but cleaning and maintenance work is troublesome because a plurality of current plates for exhaust are provided to lose the pressure of the exhaust.

The present invention has been developed in view of the above circumstances, and its object is to facilitate the maintenance work against clogging due to impurities such as a sublimate and the like generated by thermal processing in this kind of thermal processing apparatus.

To achieve the above object, a thermal processing apparatus of the present invention includes a thermal processing plate for mounting and thermally processing the substrate thereon, and a lid body covering the thermal processing plate from above to constitute a portion of the processing chamber. The lid body includes an upper surface portion and a peripheral side portion vertically provided at a peripheral end portion of the upper surface portion. The upper surface portion of the lid body is provided with a supply port for supplying a gas into the processing chamber, and a side portion of the upper surface portion of the lid body is provided with a plurality of exhaust ports for exhausting the gas in the processing chamber, and an exhaust pipe communicating with the exhaust ports and having an outlet at a point at equal distances from the exhaust ports is provided to be attachable and detachable to/from the lid body.

This configuration causes the gas supplied from the supply port provided in the upper surface portion of the lid body to flow through the plurality of exhaust ports provided in the side portion of the upper surface portion of the lid body into the exhaust pipe, and be exhausted to the outside via the outlet pipe connected to the outlet provided at a point at equal distances from the exhaust ports in the exhaust pipe. Accordingly, contamination of the substrate by the impurities such as a sublimate and the like generated from the substrate thermally processed is prevented. Further, since the impurities such as a sublimate and the like flow through the plurality of exhaust ports provided in the lid body into the exhaust pipe together with the gas, and is exhausted to the outside via the outlet pipe connected to the exhaust ports provided in the exhaust pipe, the impurities hardly adhere to the inner surface of the outlet pipe. Further, if the impurities adhere to the inner surface of the exhaust pipe to clog the exhaust pipe, the exhaust pipe can be detached from the lid body and easily cleaned.

An exhaust dispersion ring constituting an exhaust path in cooperation with the peripheral side portion and having a plurality of air holes may be provided on the inner side of the peripheral side portion of the lid body in a manner to be attachable and detachable to/from the lid body. The exhaust dispersion ring can uniform the temperature of the thermal processing for the substrate.

The upper surface portion of the lid body may be provided with four exhaust ports at regular intervals, the exhaust pipe may include two exhaust pipe bodies each of which communicates with the exhaust ports at two positions via sealing members respectively and a coupling pipe body allowing the two exhaust pipe bodies to communicate with each other, and the coupling pipe body may be provided with an outlet. For example, the form of the exhaust pipe may be made in an almost H-shape.

An attachment member having an attachment hole may be provided projecting in a horizontal direction at a central portion of the exhaust pipe, and a fixing member penetrating through the attachment hole may be fixed to an attachment receiving portion provided on the upper surface portion of the lid body to be attachable and detachable.

The exhaust dispersion ring may include an upper piece and a lower piece vertically opposed to each other and have a cross section in a channel shape, the upper piece and the lower piece may be formed with a plurality of air holes respectively at positions not aligned with each other in the vertical direction, and an aperture ratio of the air holes in the lower piece is preferably set greater than an aperture ratio of the air holes in the upper piece.

A dispersion nozzle having radial flow paths for dividing the gas to be supplied into the processing chamber via the support port in radial directions may be provided on a lower surface of the lid body. Dispersing the supplied gas can uniform the temperature of thermal processing for the substrate.

A coating film made of a synthetic resin, which a volatile component hardly adheres to and easily peels off even if the component adheres thereto, may be formed on an inner side surface of the exhaust pipe. Alternatively, an inner tube made of a synthetic resin, which a volatile component hardly adheres to and easily peels off even if the component adheres thereto, may be inserted in the exhaust pipe. This can reduce the amount of impurities adhering to the inner side surface of the exhaust pipe and easily remove the adhering impurities, thus further extending the maintenance interval and increasing the life of the apparatus.

An impurity collecting portion may be provided in the exhaust pipe.

The exhaust pipe may be provided with two outlets, and a sensor for detecting clogging with an exhaust fluid may be provided along one of exhaust paths connected to the outlets, and a valve opening/closing based on a signal from the sensor may be provided along the other exhaust path. Thus, when mainly used one of outlet pipes is clogged, the other outlet pipe can be used to exhaust the gas, so that the maintenance cycle can be doubled and the life of the apparatus can be extended.

An exhauster may be provided along an outlet pipe connected to the outlet of the exhaust pipe at a position near the outlet. This can transfer the heat generated from the thermal processing apparatus to the exhauster to increase the temperature of the exhauster itself, to thereby prevent a reduction in flow rate due to adherence of the volatile component contained in the impurities, thus further increasing the exhaust efficiency.

The exhaust ports provided in the lid body may be arranged and formed so that the exhaust flowing from the exhaust ports to the exhaust pipe flows in a spiral form as seen in plan view. A spiral groove may be formed in a surface of the exhaust dispersion ring opposed to the peripheral side portion. This can cause the impurities in the exhaust fluid flowing from the processing chamber to the exhaust port side to adhere to the inner surface of the peripheral side portion of the lid body, thus preventing the amount of the impurities adhering to the inner side surface of the exhaust pipe to extend the maintenance interval.

According to the present invention, contamination of the substrate due to the impurities such as a sublimate and the like generated from the substrate thermally processed can be prevented to improve the yields. Further, adherence of the impurities to the inner surface of the outlet path can be made hardly occur and the exhaust pipe to which the impurities have adhered can be detached from the lid body and cleaned, thus improving the reliability of the apparatus and facilitating the maintenance thereof.

DETAILED DESCRIPTION OF THE INVENTION

Hereinafter, best embodiments of the present invention will be described with reference to the accompanying drawings. A case will be described in which a thermal processing apparatus according to the present invention is applied to a heat processing apparatus in a resist coating and developing treatment system for a semiconductor wafer.

Figure 1:
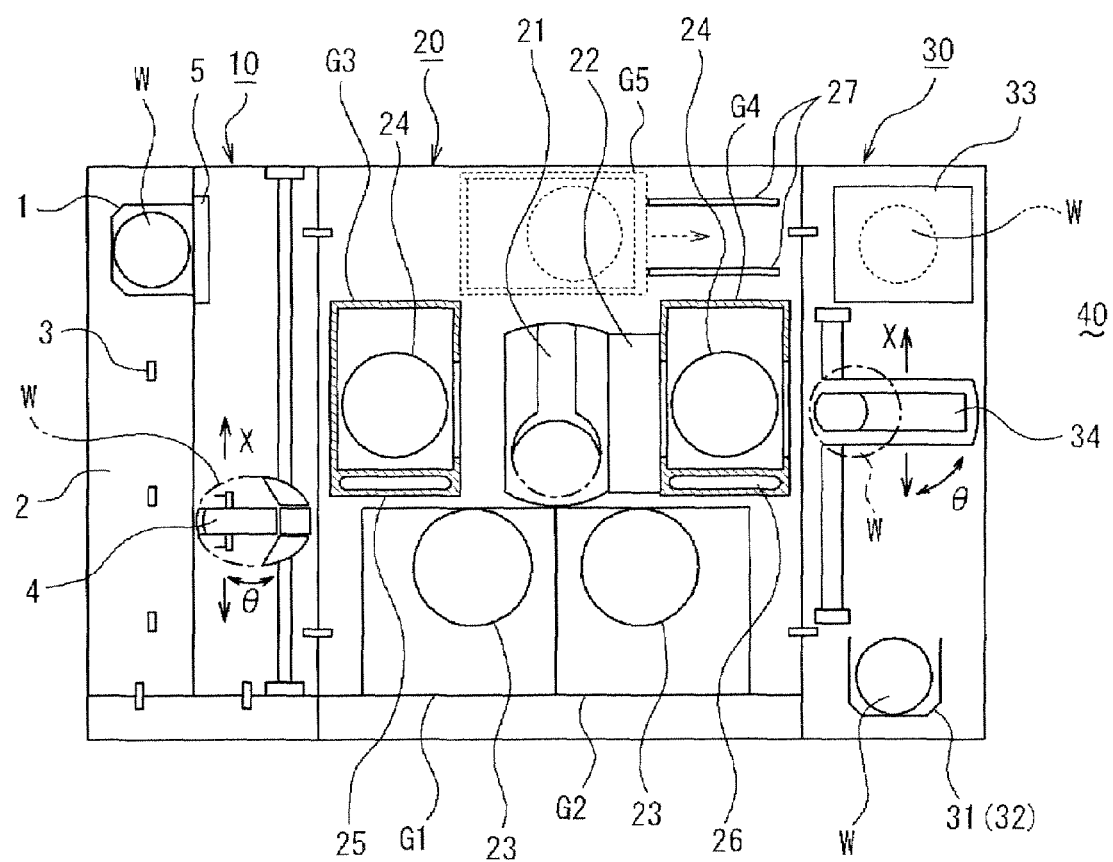
FIG. 1 is a plan view schematically showing a resist coating and developing treatment system in which a thermal processing apparatus according to an embodiment is installed.
Figure 2:
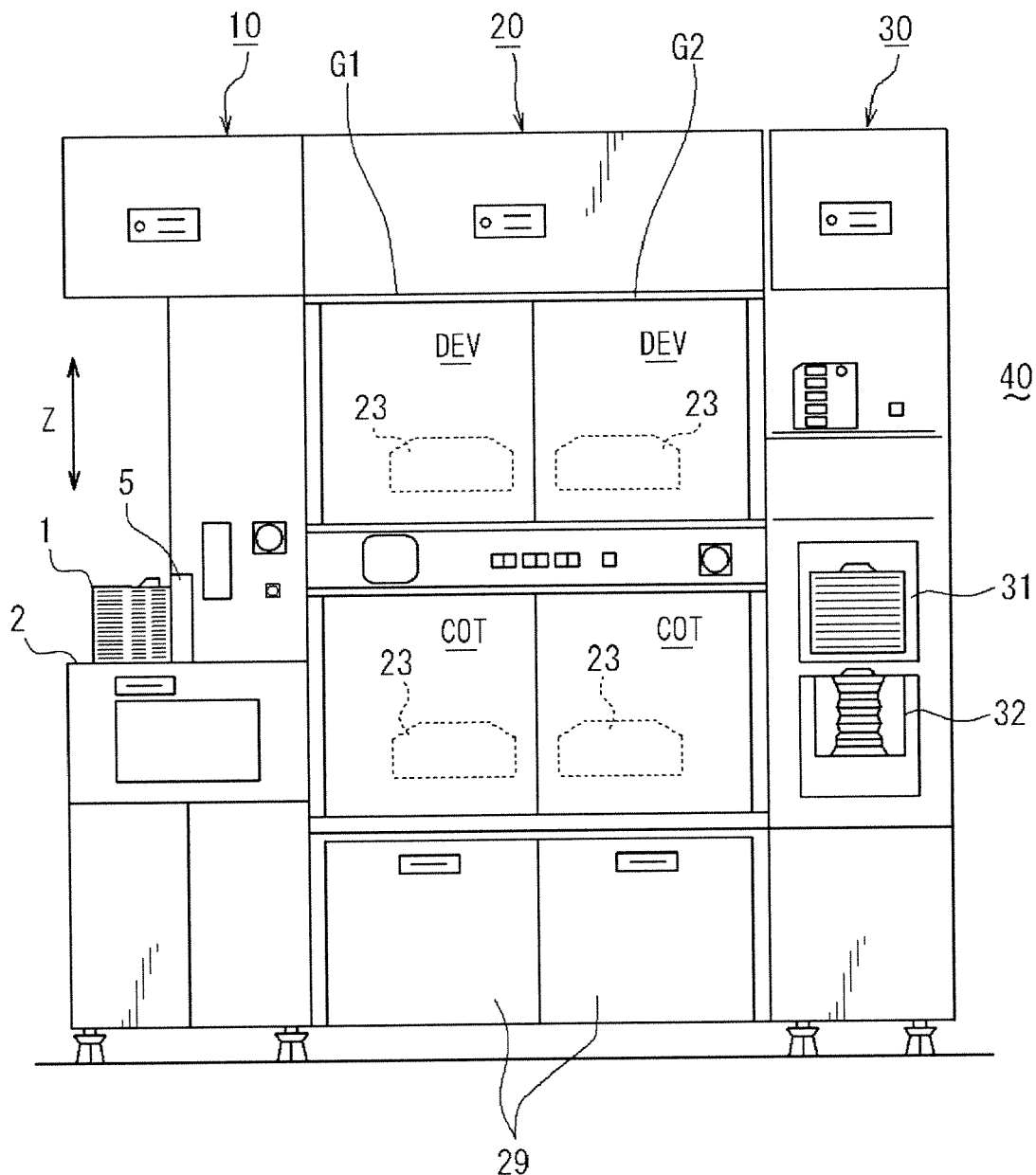
FIG. 2 is a front view schematically showing the resist coating and developing treatment system in FIG. 1.
Figure 3:
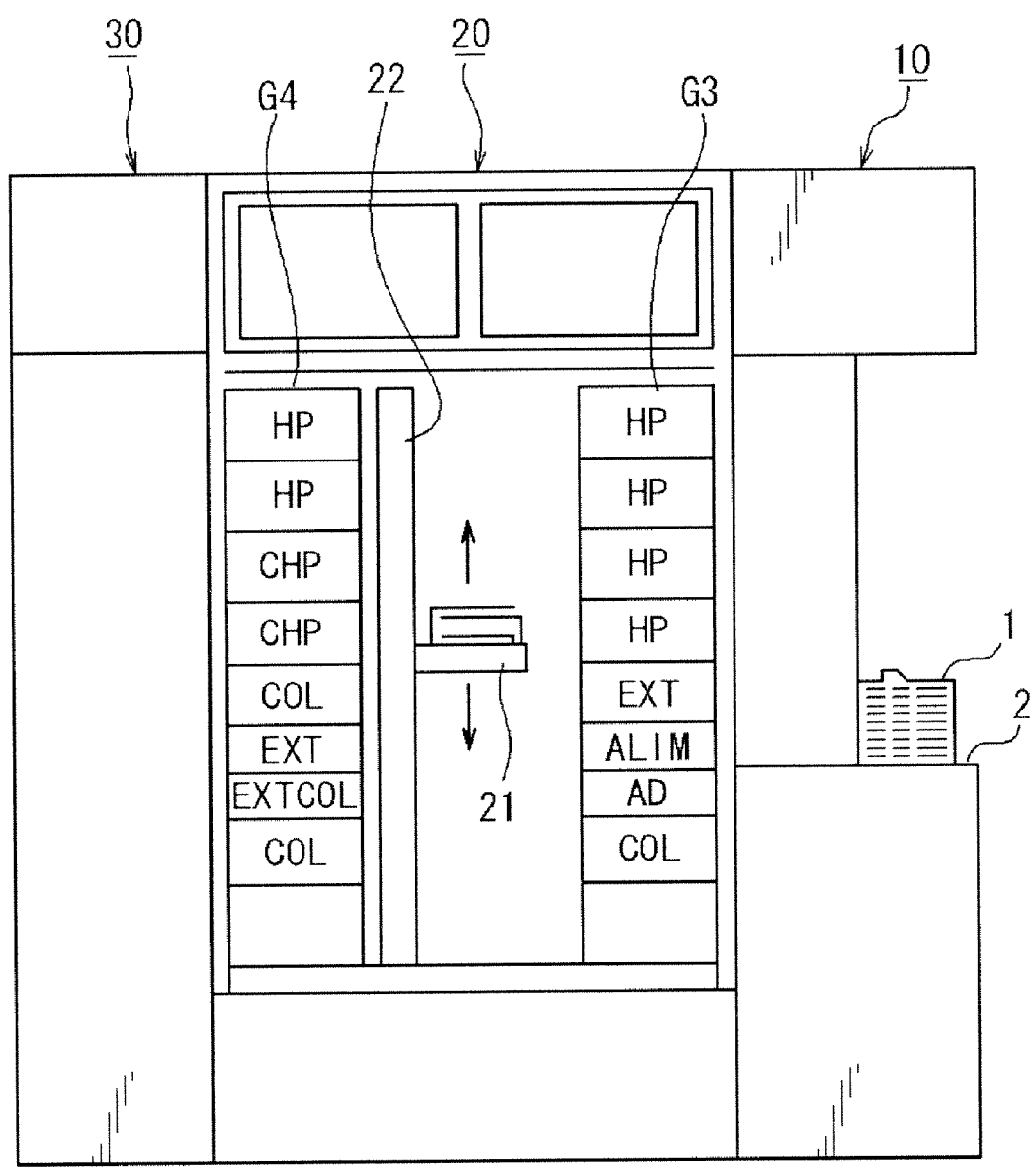
FIG. 3 is a rear view schematically showing the resist coating and developing treatment system in FIG. 1.

FIG. 1 is a plan view of the resist coating and developing treatment system, FIG. 2 is a front view of FIG. 1, and FIG. 3 is a rear view of FIG. 1.

The primary part of the resist coating and developing treatment system is composed of a cassette station 10 (transfer section) for transferring in or transferring out a plurality of, for example, 25 semiconductor wafers W (hereinafter referred to as wafers W) being substrates, as a unit, in a wafer cassette 1 from/to the outside to/from the system, and transferring-in/out the wafers W from/to the wafer cassette 1; a treatment station 20 comprising treatment and processing apparatuses composed of various kinds of multi-tiered treatment and processing units disposed at predetermined positions for performing, in a single wafer treatment manner, predetermined treatments or processing for the wafers W one by one in the coating and developing steps; and an interface section 30 for passing the wafer W to/from an aligner (not shown) provided adjacent to the treatment station 20.

The cassette station 10 is configured, as shown in FIG. 1, such that a plurality of, for example, up to four lidded wafer cassettes 1 are mounted at projections 3 on a cassette mounting table 2 in a line along a horizontal X-direction with the respective wafer ports facing toward the treatment station 20 side, a lid open/close device 5 is disposed facing each of the wafer cassettes 1. Further, a pair of tweezers 4 for wafer transfer which is movable in a cassette-arrangement direction (an X-direction) and in a wafer-arrangement direction (a Z-direction) of the wafers W housed along a vertical direction in the wafer cassette 1, selectively transfers the wafer W to each of the wafer cassettes 1. The pair of tweezers 4 for wafer transfer is configured to be rotatable in a θ-direction and can transfer the wafer W to an alignment unit (ALIM) and an extension unit (EXT) included in a multi-tired unit section in a later-described third group G3 on the treatment station 20 side.

In the treatment station 20, as shown in FIG. 1, a vertical transfer-type main wafer transfer mechanism 21 vertically moving by means of a moving mechanism 22 is provided at its central part, and all of the treatment and processing units are multi-tiered in one or more groups around the main wafer transfer mechanism 21. In this example, five groups G1, G2, G3, G4 and G5 have multi-tier arrangement, the multi-tiered units in the first and second groups G1 and G2 being arranged side by side on the front side of the system, the multi-tiered units in the third group G3 being arranged adjacent to the cassette station 10, the multi-tiered units in the fourth group G4 being arranged adjacent to the interface section 30, and the multi-tiered units in the fifth group G5 being arranged on the rear side.

As shown in FIG. 2, in the first group G1, a developing unit (DEV) for developing a resist pattern with the wafer W facing a developing solution supply means (not shown) in a cup (container) 23, and a resist coating unit (COT) for performing a predetermined treatment with the wafer W mounted on a spin chuck (not shown), are stacked on two tiers vertically in order from the bottom. In the second group G2, two units, that is, a resist coating units (COT) and a developing unit (DEV) are similarly stacked on two tiers vertically in order from the bottom. The reason why the resist coating unit (COT) is disposed on the lower tier side as described above is that drainage of the resist solution is troublesome in terms of mechanism and maintenance. However, it is also possible to dispose the resist coating unit (COT) on the upper tier if necessary.

As shown in FIG. 3, in the third group G3, oven-type processing units each performing predetermined processing with the wafer W mounted on a wafer mounting table 24, such as a cooling unit (COL) for cooling the wafer W, an adhesion unit (AD) for performing hydrophobic treatment for the wafer W, an alignment unit (ALIM) for performing alignment of the wafer W, an extension unit (EXT) for transferring-in/out the wafer W, four hot plate units (HP) each for baking the wafer W employing a thermal processing unit according to the present invention are stacked, for example, on eight tiers vertically in order from the bottom. Similarly, in the fourth group G4, oven-type processing units, such as a cooling unit (COL), an extension and cooling unit (EXTCOL), an extension unit (EXT), a cooling unit (COL), two chilling and hot plate units (CHP) each having a rapid cooling function, and two hot plate units (HP) employing thermal processing units according to the present invention are stacked, for example, on eight tiers vertically in order from the bottom.

As described above, the cooling units (COL) and the extension and cooling unit (EXTCOL) with low processing temperatures are disposed on lower tiers, and the hot plate units (HP), the chilling and hot plate units (CHP) and the adhesion unit (AD) with high processing temperatures are disposed on upper tiers, thus enabling less mutual thermal interference between the units. As a matter of course, a random multi-tier arrangement is also possible.

Note that as shown in FIG. 1, in the treatment station 20, the side walls of the multi-tiered units (the oven-type processing units) in the third and fourth groups G3 and G4 adjacent to the multi-tiered units (the spinner-type treatment units) in the first and second groups G1 and G2, are provided with ducts 25 and 26 which are longitudinally positioned in the vertical direction, respectively. Through these ducts 25 and 26, down-flow clean air or specifically temperature-controlled air flows. The duct structure blocks the heat generated in the oven-type processing units in the third and fourth groups G3 and G4 to prevent the heat from reaching the spinner-type treatment units in the first and second groups G1 and G2.

Further, in the treatment system, multi-tiered units in the fifth group G5 can also be arranged as shown by a dotted line in FIG. 1 on the rear side of the main wafer transfer mechanism 21. The multi-tiered units in the fifth group G5 can be moved along guide rails 27 in the lateral direction as seen from the main wafer transfer mechanism 21. Accordingly, even if the multi-tiered units in the fifth group G5 are provided, the maintenance work can be easily performed for the main wafer transfer mechanism 21 from the rear side because a space can be secured by sliding the units.

The interface section 30 has the same dimension as that of the treatment station 20 in the depth direction but has a smaller size than the treatment station 20 in the width direction. In the interface section 30, a transportable pick-up cassette 31 and a stationary buffer cassette 32 are two-tiered at the front portion, an edge exposure apparatus 33 being an exposure means for performing exposure for the edge portion of the wafer W and for the identification mark region is disposed at the rear portion, and a transfer arm 34 for the wafer being a transfer means is disposed at the central portion. The transfer arm 34 is configured to move in the X- and Z-directions to transfer the wafer W to both the cassettes 31 and 32 and to the edge exposure apparatus 33. The transfer arm 34 is also configured to be rotatable in the θ-direction to be able to perform transfer to the extension unit (EXT) included in the multi-tiered units in the fourth group G4 on the treatment station 20 side and to a wafer delivery table (not shown) on the aligner side adjacent thereto.

The treatment system configured as described above is installed in a clean room 40, and the cleanliness in each unit is increased by an efficient vertical laminar flow method also in the system.

In the resist solution coating and developing treatment system configured as described above, first of all, the lid open/close device 5 operates to open the lid of a predetermined wafer cassette 1 in the cassette station 10. Next, the pair of tweezers 4 for wafer accesses the cassette 1 housing unprocessed wafers W on the cassette mounting table 2 and takes one wafer W out of the cassette 1. After taking the wafer W out of the cassette 1, the pair of tweezers 4 for wafer moves to the alignment unit (ALIM) disposed in the multi-tiered units in the third group G3 on the treatment station 20 side and mounts the wafer W onto the wafer mounting table 24 in the unit (ALIM). The wafer W is subjected to orientation flat placement and centering on the wafer mounting table 24. Thereafter, the main wafer transfer mechanism 21 accesses the alignment unit (ALIM) from the opposite side and receives the wafer W from the wafer mounting table 24.

In the treatment station 20, the main wafer transfer mechanism 21 first transfers the wafer W into the adhesion unit (AD) included in the multi-tiered units in the third group G3. In the adhesion unit (AD), the wafer W is subjected to the hydrophobic treatment. After completion of the hydrophobic treatment, the main wafer transfer mechanism 21 transfers the wafer W out of the adhesion unit (AD) and then transfers the wafer W into the cooling unit (COL) included in the multi-tiered units in the third group G3 or the fourth group G4. In the cooling unit (COL), the wafer W is cooled to a set temperature before the resist coating treatment, for example, 23° C. After completion of the cooling treatment, the main wafer transfer mechanism 21 transfers the wafer W out of the cooling unit (COL) and then transfers the wafer W into the resist coating unit (COT) included in the multi-tiered units in the first group G1 or the second group G2. In the resist coating unit (COT), the wafer W is coated with a resist with a uniform film thickness over the wafer surface by the spin coating method.

After completion of the resist coating treatment, the man wafer transfer mechanism 21 transfers the wafer W out of the resist coating unit (COT) and then transfers the wafer W into the hot plate unit (HP). In the hot plate unit (HP), the wafer W is mounted on the mounting table and subjected to pre-baking processing at a predetermined temperature, for example, 100° C. for a predetermined time. This can evaporate and remove the residual solvent from the coating film on the wafer W. After completion of the pre-baking, the main wafer transfer mechanism 21 transfers the wafer W out of the hot plate unit (HP) and then transfers the wafer W to the extension and cooling unit (EXTCOL) included in the multi-tiered units in the fourth group G4. In the unit (EXTCOL), the wafer W is cooled to a temperature, for example, 24° C., suitable for the subsequent step, that is, the edge exposure processing in the edge exposure apparatus 33. After the cooling, the main wafer transfer mechanism 21 transfers the wafer W to the extension unit (EXT) immediately above it, and mounts the wafer W on the mounting table (not shown) in the unit (EXT). When the wafer W is mounted on the mounting table in the extension unit (EXT), the transfer arm 34 in the interface section 30 accesses it from the opposite side and receives the wafer W. The transfer arm 34 then transfers the wafer W into the edge exposure apparatus 33 in the interface section 30. In the edge exposure apparatus 33, light is applied to the excessive resist film (portion) at the peripheral portion on surface of the wafer W, so that the wafer W is subjected to edge exposure.

After completion of the edge exposure, the transfer arm 34 transfers the wafer W out of the casing of the edge exposure apparatus 33 and transports it to a wafer receiving table (not shown) on the aligner side adjacent thereto. In this case, the wafer W may be temporarily housed in the buffer cassette 32 before being delivered to the aligner.

After exposure of the entire surface in the aligner is finished and the wafer W is returned to the wafer receiving table on the aligner side, the transfer arm 34 in the interface section 30 accesses the wafer receiving table and receives the wafer W, and then transfers the received wafer W into the extension unit (EXT) included in the multi-tiered units in the fourth group G4 on the treatment station 20 side and mounts the wafer W on the wafer receiving table. Also in this case, the wafer W may be temporarily housed in the buffer cassette 32 in the interface section 30 before the wafer W is passed to the treatment station 20 side.

The wafer W mounted on the wafer receiving table is transferred by the main wafer transfer mechanism 21 to the chilling and hot plate unit (CHP) and subjected to post-exposure baking processing, for example, at 120° C. for a predetermined time in order to prevent occurrence of fringe or induce acid catalyst reaction with a chemically amplified resist (CAR).

Thereafter, the wafer W is transferred into the developing unit (DEV) included in the multi-tiered units in the first group G1 or the second group G2. In the developing unit (DEV), the resist on the surface of the wafer W is evenly supplied with the developing solution to be subjected to the developing treatment. This developing treatment develops the resist film formed on the surface of the wafer W in a predetermined circuit pattern and removes the excessive resist film at the peripheral portion of the wafer W, and removes the resist film adhering to the region with an alignment mark M formed (applied) on the surface of the wafer W. After the development is finished as described above, a rinse solution is applied on the surface of the wafer W to wash away the developing solution.

After completion of the developing step, the main wafer transfer mechanism 21 transfers the wafer W out of the developing unit (DEV) and then transfers the wafer W into the hot plate unit (HP) included in the multi-tiered units in the third group G3 or the fourth group G4. In this unit (HP), the wafer W is subjected to post-baking processing, for example, at 100° C. for a predetermined time. This hardens the resist swelled by the development, resulting in improved chemical resistance.

After completion of the post-baking, the main wafer transfer mechanism 21 transfers the wafer W out of the hot plate unit (HP) and then transfers the wafer W into any of the cooling units (COL). After the wafer W is retuned to room temperature, the main wafer transfer mechanism 21 transports the wafer W to the extension unit (EXT) included in the third group G3. When the wafer W is mounted on the mounting table (not shown) in the extension unit (EXT), the pair of tweezers 4 for wafer transfer on the cassette station 10 side accesses it from the opposite side and receives the wafer W. The pair of tweezers 4 for wafer transfer inserts the received wafer W into a predetermined wafer housing groove in the wafer cassette 1 for housing processed wafers on the mounting table, and after all of the processed wafers W are housed into the wafer cassette 1, the lid open/close device 5 operates to close the lid, with which the processing ends.

Next, the thermal processing apparatus according to the embodiment of the present invention constituting the above-described hot plate unit (HP) and chilling and hot plate unit (CHP) will be described in detail with reference to FIG. 4 through FIG. 17. A case will be described now in which the thermal processing apparatus according to the present invention is applied to the heat processing apparatus for pre-baking the wafer W coated with the resist.

First Embodiment

Figure 4:
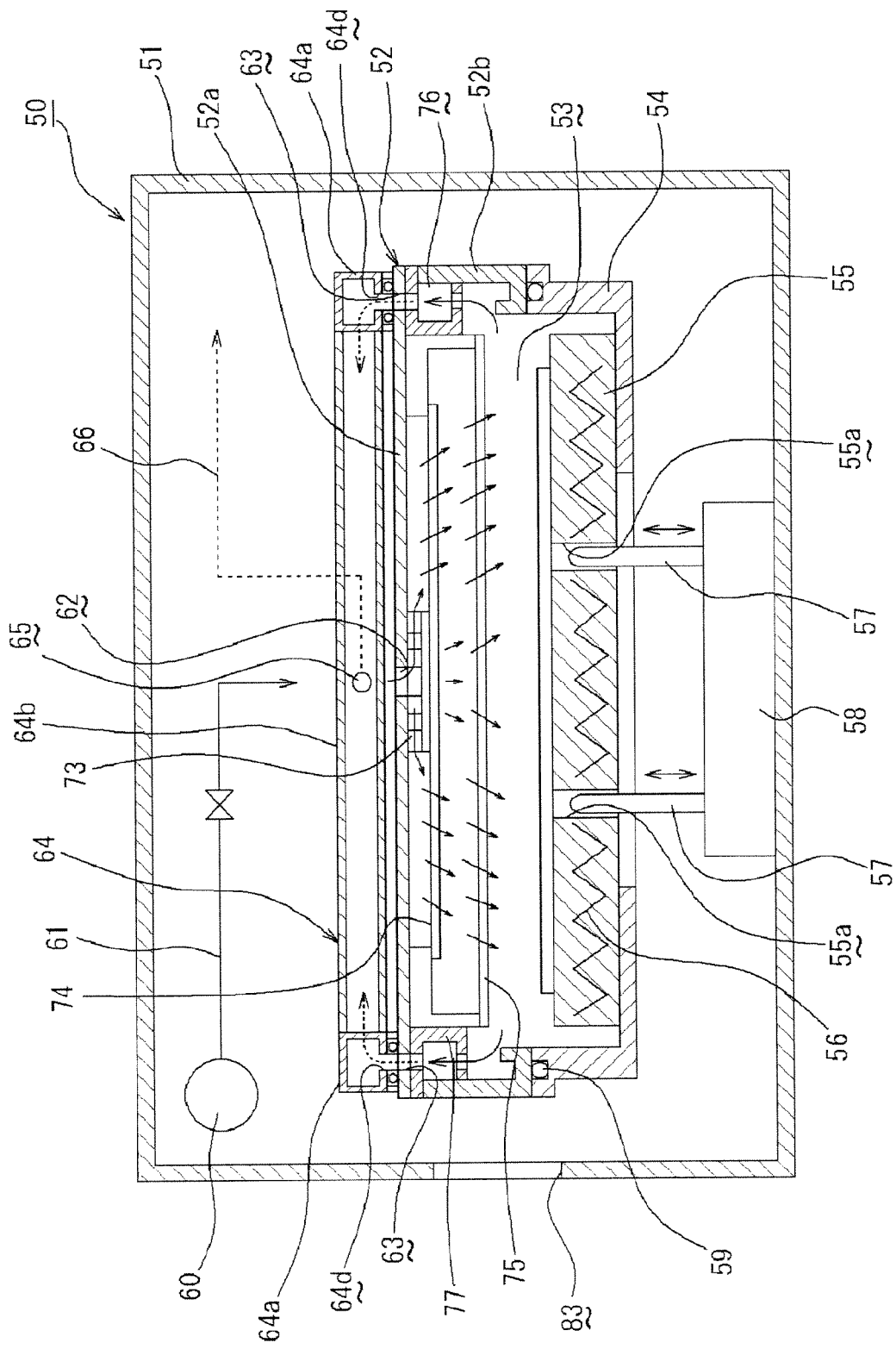
FIG. 4 is an explanatory view of a cross section showing the usage state of the first embodiment of the present invention.
Figure 5:
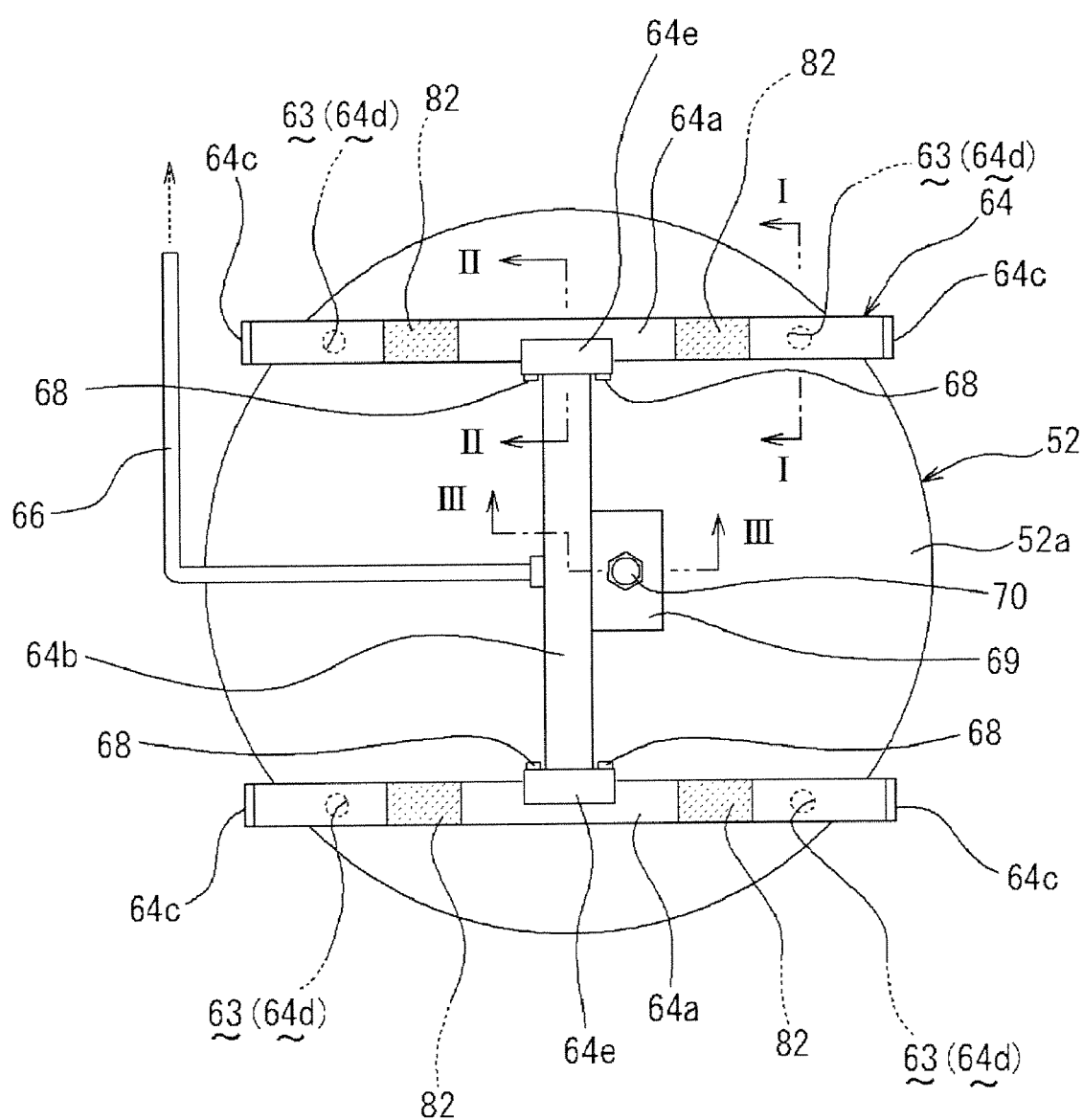
FIG. 5 is a plan view showing the principal part of the thermal processing apparatus in FIG. 4.
Figure 6:
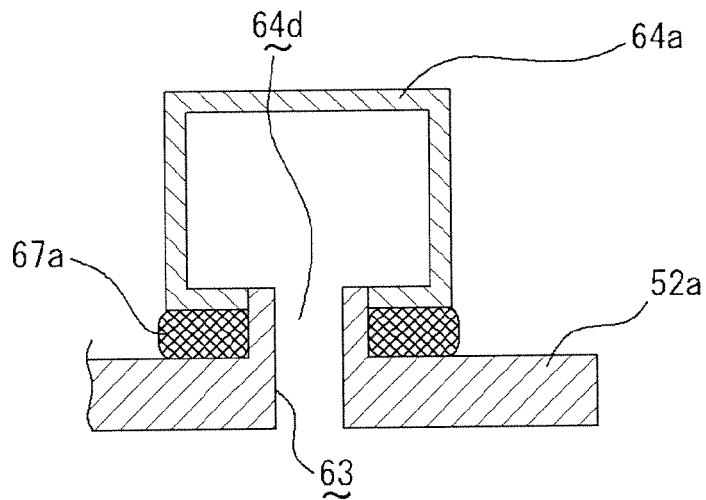
FIG. 6 is a cross-sectional view taken along a I-I line in FIG. 5.
Figure 7:
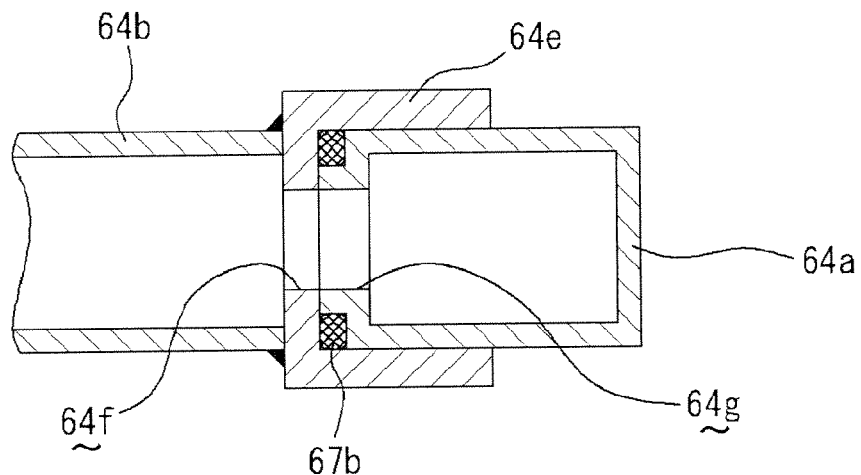
FIG. 7 is a cross-sectional view taken along a II-II line in FIG. 5.
Figure 8:
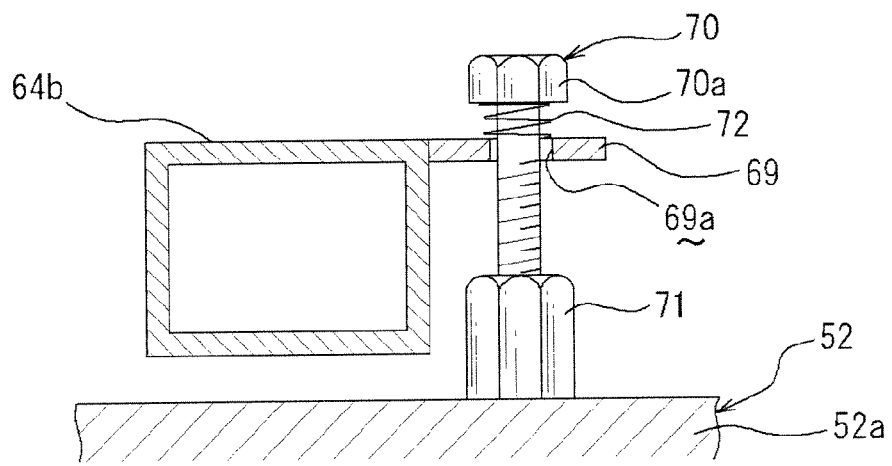
FIG. 8 is a cross-sectional view taken along a III-III line in FIG. 5.

FIG. 4 is a cross-sectional view showing the usage state of a first embodiment, FIG. 5 is a plan view showing the principal part of the thermal processing apparatus, and FIG. 6 to FIG. 8 are a cross-sectional view taken along a I-I line in FIG. 5, a cross-sectional view taken along a II-II line in FIG. 5, and a cross-sectional view taken along a III-III line in FIG. 5 respectively.

A thermal processing apparatus 50 includes in a casing 51, as shown in FIG. 4, a vertically movable lid body 52, and a support ring 54 located on the lower side of the lid body 52 and constituting a processing chamber 53 in cooperation with the lid body 52.

The support ring 54 has, for example, an almost cylindrical shape with upper and lower faces open, and houses a heating plate 55 as a thermal processing plate therein. Housing the heating plate 55 closes the lower face of the support ring 54. The heating plate 55 has a thick disk shape to mount and heat the wafer W being the substrate on its upper surface. In the heating plate 55, a heater 56 is embedded which generates heat by feed of electric power, so that the heating plate 55 itself can be heated to and maintained at a predetermined temperature. In other words, mounting the wafer W on the heating plate 55 heated to the predetermined temperature can heat the wafer W to the predetermined temperature.

The heating plate 55 is formed with, for example, three through holes 55a, and support pins 57 for raising and lowering the wafer W while supporting its rear surface are inserted into the through holes 55a respectively. The support pins 57 are raised and lowered by a raising and lowering mechanism 58 including, for example, a cylinder or the like. The support pins 57 can rise to a position above the heating plate 55 to deliver and receive the wafer W to/from the main wafer transfer mechanism 21 and mount the received wafer W onto the heating plate 55.

On the upper surface of the support ring 54, an O-ring 59 is provided to prevent the gas in the processing chamber 53 from flowing out through the gap between the upper surface of the support ring 54 and the lower end portion of a peripheral side portion 52b of the lid body 52.

The lid body 52 has a form with its lower surface side open, constituted of a ceiling plate 52a being the upper surface portion and the peripheral side portion 52b vertically provided at the peripheral end portion of the ceiling plate 52a. The ceiling plate 52a faces the wafer W on the heating plate 55. A supply port 62 to which a gas supply pipe 61 is connected is provided at the central portion on the ceiling plate 52a. The gas supply pipe 61 communicates with a gas supply source 60 (placed outside the thermal processing apparatus 50) for supplying a gas, for example, air, a nitrogen gas, an inert gas, or the like. Accordingly, the gas such as air, a nitrogen gas, an inert gas, or the like from the gas supply source 60 is supplied to the supply port 62 via the gas supply pipe 61 and introduced from the supply port 62 into the processing chamber 53.

At the peripheral portion of the ceiling plate 52a, a plurality of, for example, four exhaust ports 63 for exhausting the gas in the processing chamber 53 are provided at regular intervals. An exhaust pipe 64 having a plan form of an almost H-shape communicates with the exhaust ports 63, and an outlet 65 is provided in the exhaust pipe 64 at a point at almost equal distances from the exhaust ports 63. To the outlet 65, an outlet pipe 66 is connected which is constituted of a tube made of, for example, a synthetic resin. The diameter of the outlet pipe 66 is smaller than the diameter of the exhaust pipe 64.

As shown in FIG. 5, FIG. 6, FIG. 7, and FIG. 9, the exhaust pipe 64 is formed in an almost H-shape including two exhaust pipe bodies 64a and 64a each of which communicates with the exhaust ports 63 at two positions via the O-rings 67a being sealing members, and a coupling pipe body 64b allowing those exhaust pipe bodies 64a and 64a to communicate with each other, and the outlet 65 is provided at the middle portion of the coupling pipe body 64b. Each of the exhaust pipe bodies 64a and the coupling pipe body 64b is constituted, for example, of a rectangular cylinder made of an aluminum alloy. Note that the end opening portion of the exhaust pipe body 64a is closed by a closing material 64c.

As shown in FIG. 6, communication holes 64d are formed at both end bottom portions of the exhaust pipe body 64a, edge portions of the exhaust ports 63 projecting from the upper surface of the ceiling plate 52a are fitted into the communication holes 64d, and an O-ring 67 is provided around the edge portions and between the bottom surfaces of the exhaust pipe bodies 64a and the ceiling plate 52a. This allows the exhaust ports 63 to hermetically communicate with the exhaust pipe bodies 64a.

Figure 9:
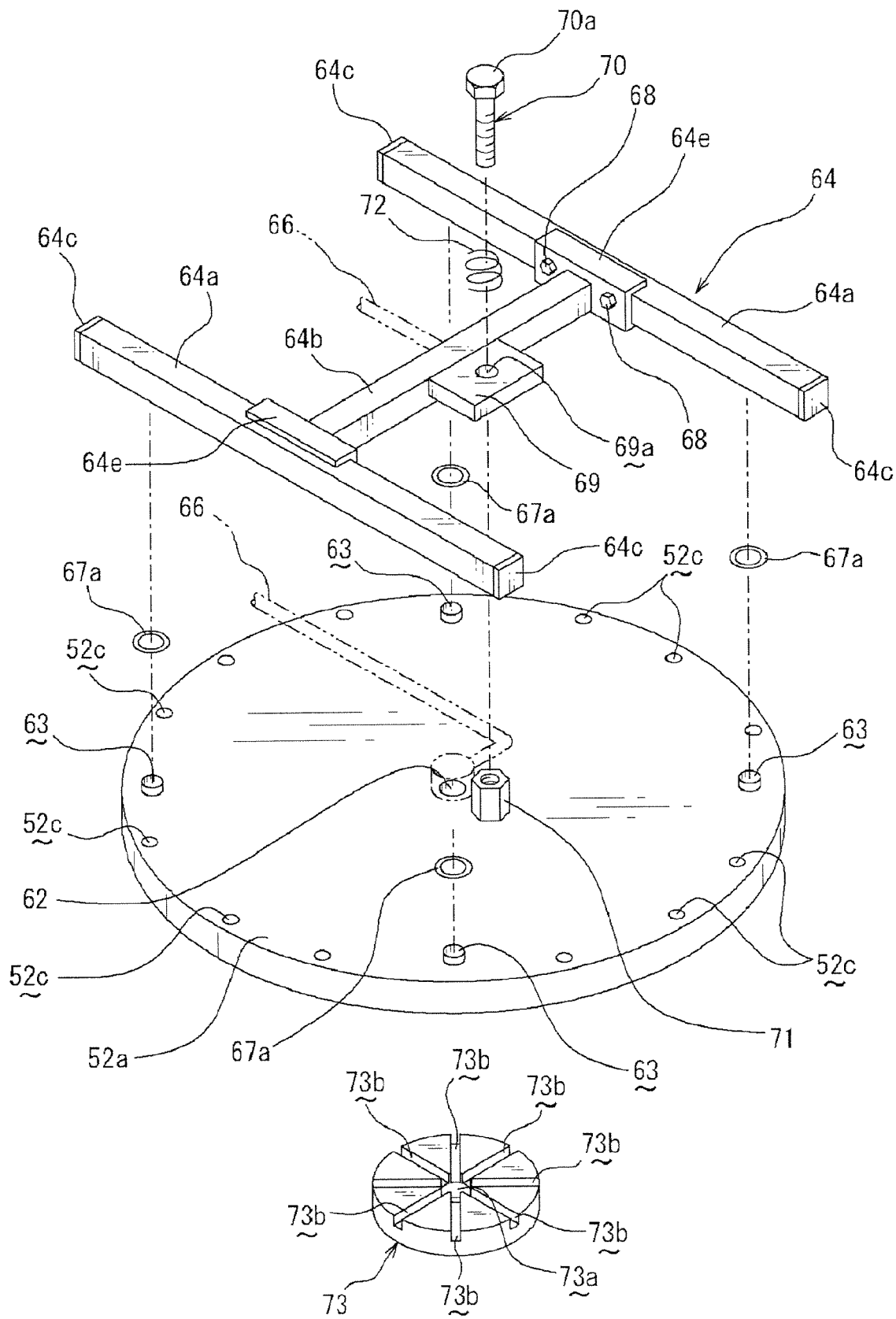
FIG. 9 is an exploded perspective view showing a lid body, an exhaust pipe and a dispersion nozzle in the embodiment.

At both end portions of the coupling pipe body 64b, coupling members 64e each in a channel shape gripping one side portion of the exhaust pipe body 64a is integrally formed, for example, by welding or the like. As shown in FIG. 7, the side portion of the exhaust pipe body 64a is fitted into the coupling member 64e via a sealing member, for example, an O-ring 67b, whereby a communication hole 64f of the coupling member 64e is connected to a communication port 64g at the side portion of the exhaust pipe body 64a. In this state, as shown in FIG. 5 and FIG. 9, fixing screws 68 penetrating attachment holes (not shown) provided in the coupling members 64e are screw-coupled to the side portions of the exhaust pipe bodies 64a, whereby the exhaust pipe bodies 64a are fixed to the coupling pipe body 64b. Releasing the screw-coupling separates them. Thus, the exhaust pipe bodies 64a and the coupling pipe body 64b are freely attachable and detachable to each other.

As shown in FIG. 5, FIG. 8 and FIG. 9, an attachment member 69 having an attachment hole 69a is provided horizontally projecting at the upper end portion on one side of the central portion of the coupling pipe body 64b, located at an almost center of the exhaust pipe 64.

Through the attachment hole 69a of the attachment member 69, a fixing bolt 70 being a fixing member penetrate, and screwed together with a nut 71 being an attachment receiving portion provided on the upper surface of the ceiling plate 52a of the lid body 52. In this event, a coil spring 72 lies between a head portion 70a of the fixing bolt 70 and the attachment member 69, so that the fixing bolt 70 is tightened to evenly disperse the force pressing the whole exhaust pipe 64 toward the lid body 52 side.

The fixing bolt 70 is tightened and fixed to the nut 71 provided at the lid body 52 in the above manner, whereby the exhaust ports 63 in the ceiling plate 52a hermetically communicate with the communication holes 64d provided in the exhaust pipe 64. Further, since the whole exhaust pipe 64 is constituted in an almost H-shape by the two exhaust pipe bodies 64a and 64a and the coupling pipe body 64b allowing those exhaust pipe bodies 64a to communicate with each other, the whole exhaust pipe 64 slightly bends when the fixing bolt 70 is tightened and fixed to the nut 71, thereby allowing the exhaust ports 63 to hermetically communicate with the communication holes 64d in the exhaust pipe 64d.

On the other hand, on the lower surface side of the supply port 62 in the lid body 52, as shown in FIG. 9, a dispersion nozzle 73 is provided which divides the gas to be supplied into the processing chamber 53 in radial directions. Between the lower side of the dispersion nozzle 73 and the heating plate 55, for example, a first current plate 74 and a second current plate 75 each in a disk shape having a number of air holes are vertically arranged as shown in FIG. 4.

On the inner side of the peripheral side portion 52b of the lid body 52, an exhaust dispersion ring 77 forming an exhaust path 76 in cooperation with the peripheral side portion 52b is provided to be freely attachable and detachable to/from the lid body 52. Note that the lower end surface of the exhaust path 76 is located above the wafer W mounted on the heating plate 55.

The dispersion nozzle 73 is formed in a disk shape, as shown in FIG. 9, and a circular recessed portion 73a communicating with the supply port 62 is provided at the central portion, and a plurality of (the case of eight is shown in the drawing) radial flow paths 73b communicating with the circular recessed portion 73a are provided in radial directions.

Figure 10:
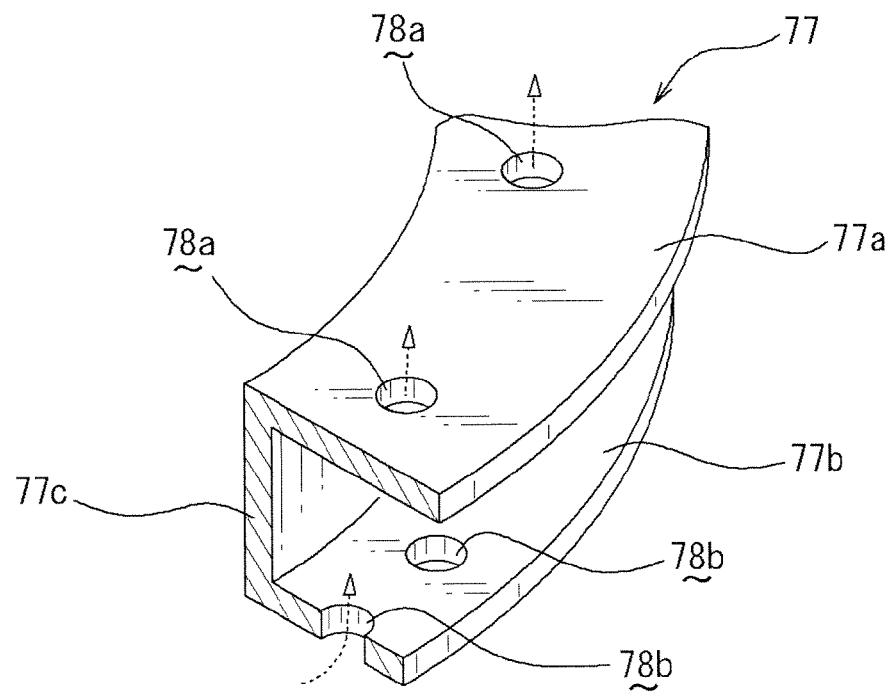
FIG. 10 is a perspective view of a cross section of a part of the principal part of the exhaust dispersion ring in the embodiment.

The exhaust dispersion ring 77 is formed to have a cross section in a channel material shape, having an upper piece 77a and a lower piece 77b vertically opposed to each other, as shown in FIG. 10, and a vertical piece 77c coupling end portions of the upper piece 77a and the lower piece 77b on the processing chamber side. The upper piece 77a and the lower piece 77b are formed with a plurality of air holes 78a and 78b at positions not aligned with each other in the vertical direction. The aperture ratio of the air holes 78b in the lower piece 77b is greater than the aperture ratio of the air holes 78a in the upper piece 77a.

The aperture ratio of the air holes 78b in the lower piece 77b is made higher than the aperture ratio of the air holes 78a in the upper piece 77a of the exhaust dispersion ring 77, whereby the exhaust flow dispersed by the lower piece 77b that is on the upstream side of the exhaust can be dispersed by the air holes 78a provided in the upper piece 77a that is on the downstream side, so as to increase in uniformity of the exhaust flow in the processing chamber 53.

Note that on the outer peripheral portion of the upper piece 77a of the exhaust dispersion ring 77, a plurality of, for example, 12 notches (not shown) are provided at appropriate intervals. Attachment bolts (not shown) penetrating through holes 52c (see FIG. 9) provided at the outer peripheral portion of the ceiling plate 52a screw-coupled to the upper end portion of the peripheral side portion 52b via the notches in the upper piece 77a with the upper piece 77a of the exhaust dispersion ring 77 sandwiched between the ceiling plate 52a and the peripheral side portion 52b, whereby the ceiling plate 52a is fixed to the exhaust dispersion ring 77 and the peripheral side portion 52b. Releasing the tightening of the attachment bolts can detach the ceiling plate 52a from the exhaust dispersion ring 77 and the peripheral side portion 52b.

Figure 11:
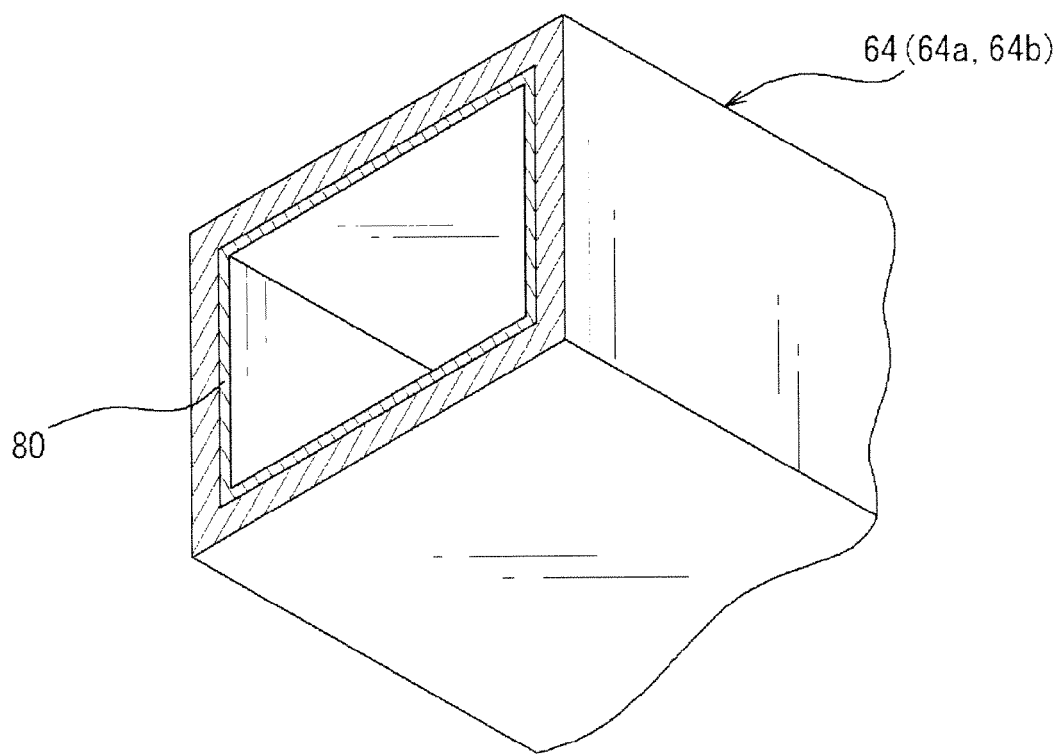
FIG. 11 is a perspective view of a cross section showing the state in which a coating film is applied to the inner surface of the exhaust pipe in the embodiment.
Figure 12:
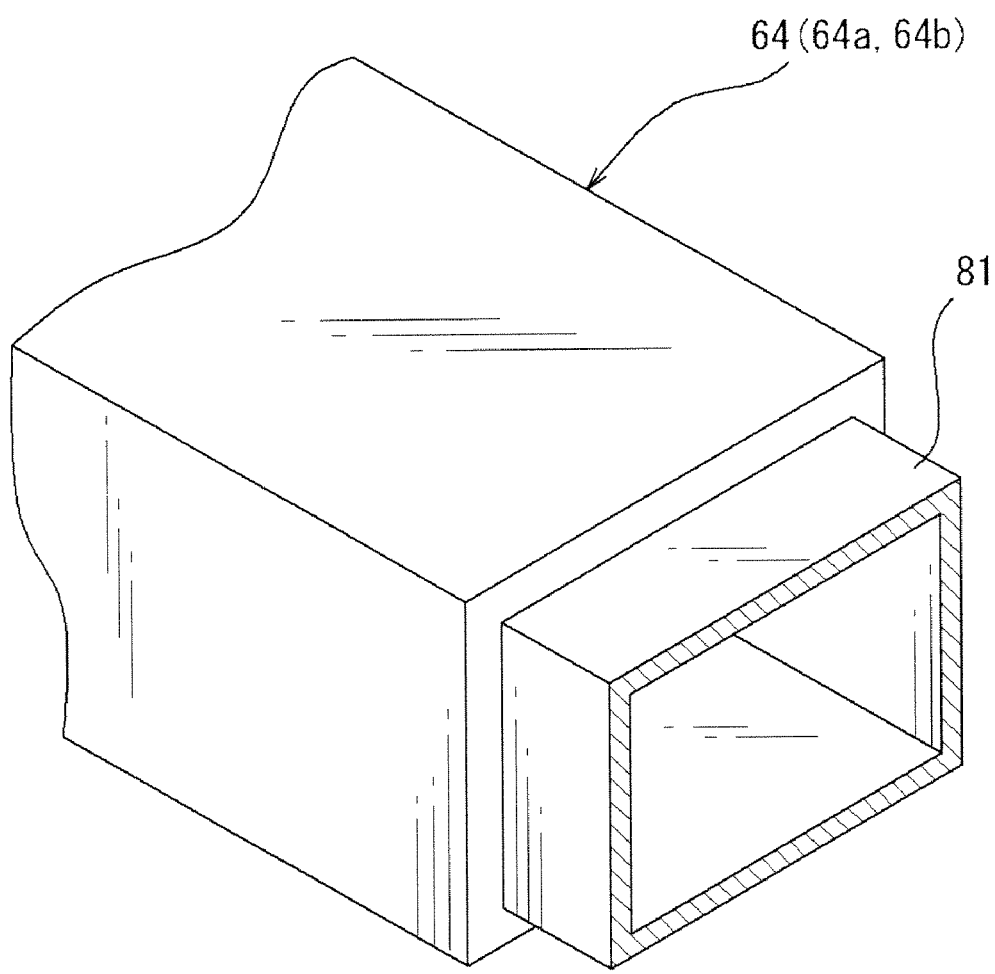
FIG. 12 is a perspective view of a cross section showing the state in which an inner tube is inserted into the exhaust pipe in the embodiment.

Although the inner surface of the exhaust pipe 64 may be in a state in which the base of the aluminum alloy is exposed in the thermal processing apparatus 50 configured as described above, the inner surface of the exhaust pipe 64 is preferably subjected to processing for preventing impurities such as a sublimate and the like from adhering thereto. The processing for preventing adherence of impurities includes forming, on the inner surface of the exhaust pipe 64, a coating of a material which a volatile component hardly adheres to and easily peels off even if it adheres thereto, for example, a fluorine resin such as Teflon™, or a coating film 80 made of a synthetic resin formed by dipping, saturation treatment or the like of a fluorine resin, for example, as shown in FIG. 11. Alternatively, in place of them, an inner tube 81 may be inserted into the exhaust pipe 64 which is made of a synthetic resin such as a PFA, PTFA, or PEEK resin or the like, which a volatile component hardly adheres to and easily peels off even if it adheres thereto as shown in FIG. 12.

This configuration can decrease the amount of impurities adhering to the inner surface of the exhaust pipe 64 and easily remove the impurities adhering thereto.

Furthermore, as shown in FIG. 5, impurity collecting portions 82, for example, a filter, a wire mesh or the like may be detachably provided on the exhaust port side in the exhaust pipe bodies 64a of the exhaust pipe 64. The impurity collecting portions 82 are detachably provided in the exhaust pipe 64 as described above, whereby the impurities can be collected by the impurity collecting portions 82, thus extending the period before the exhaust line including the exhaust pipe 64 is clogged due to adherence of impurities.

The whole lid body 52 is vertically movable by means of a not-shown raising and lowering mechanism including a cylinder or the like such that the lid body 52 is not vertically moved when the wafer W is transferred in/out. Further, the side surface of the casing 51 is provided with a transfer-in/out port 83 for transferring-in/out the wafer W by the main wafer transfer mechanism 21.

Figure 13:
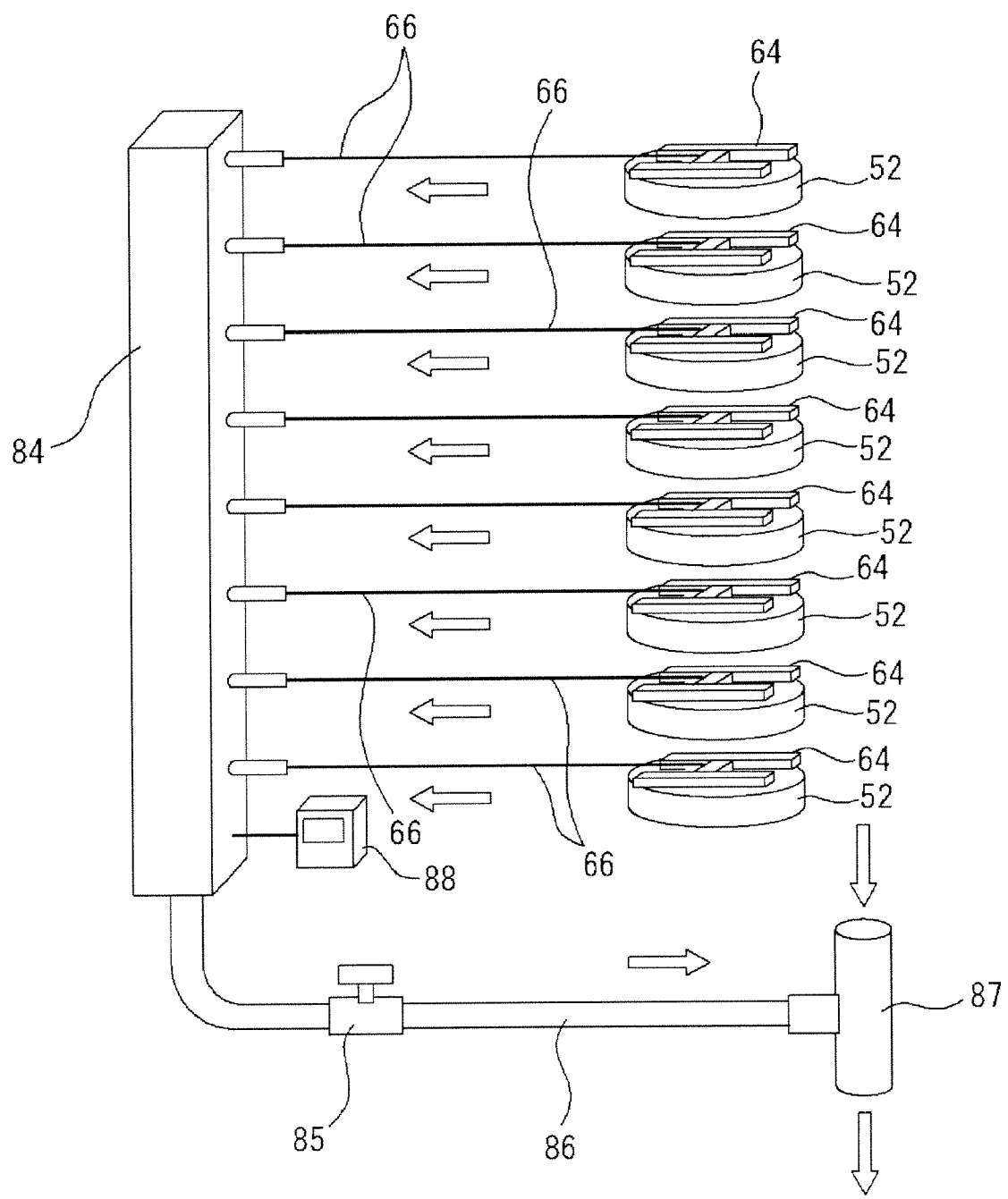
FIG. 13 is a perspective view schematically showing the state in which a plurality of thermal processing apparatuses are connected to an exhaust duct.

The thermal processing apparatuses 50 configured as described above are placed on multiple tiers, as shown in FIG. 13, and their outlet pipes 66 connected to the exhaust pipes 64 of the thermal processing apparatuses 50 are connected to an exhaust duct 84 installed in the vertical direction on the rear side of the resist coating and developing treatment system. Note that a dedicated hose 86 having a duct inner pressure regulating valve 85 is connected to the lower portion of the exhaust duct 84, and an exhaust means, for example, an ejector 87 is connected to the dedicated hose 86. A pressure sensor 88 for detecting the pressure in the exhaust duct 84 is attached to the exhaust duct 84, so that the pressure sensor 88 monitors the pressure in the exhaust duct 84.

Next, the operation of the thermal processing apparatus 50 will be described. First, a gas for purge begins to be supplied from the gas supply source 60 before the wafer W is transferred to the thermal processing apparatus 50. Further, the heating plate 55 is maintained at a predetermined heating temperature, for example, at 90° C. to 200° C. by the heater 56.

The wafer W for which the exposure processing has been completed in the aligner and held by the main wafer transfer mechanism 21 is transferred through the transfer-in/out port 83 into the casing 51 and delivered to the support pins 57 which are raised and waiting in advance at positions above the heating plate 55. Subsequently, the lid body 52 is lowered to be united with the support ring 54 to form the processing chamber 53. In this event, the gas supplied into the processing chamber 53 from the supply port 62 is divided into the radial directions by the dispersion nozzle 73 as shown in FIG. 4 and then passes through the first current plate 74 and the second current plate 75 so that the direction of the gas flow is directed toward the peripheral side portion 52b.

The gas passed through the second current plate 75 does not reach the front surface of the wafer W but passes through the exhaust path 76 constituted of the peripheral side portion 52b and the exhaust dispersion ring 77, flows from the exhaust ports 63 into the exhaust pipe 64, and is then exhausted from the exhaust outlet pipe 66 via the outlet 65 provided in the exhaust pipe 64. In this event, some of impurities such as a sublimate and the like in the gas adhere to the exhaust dispersion ring 77 during passage through the exhaust path 76, and some of impurities such as a sublimate and the like in the gas adhere to the inner surface of the exhaust pipe 64 when the gas exhausted from the exhaust ports 63 passes through the exhaust pipe 64. When the gas passes through the impurity collecting portions 82, the impurities are also collected. The gas is then exhausted to the outside via the outlet pipe 66 connected to the outlet 65. Accordingly, adherence of the impurities to the outlet pipe 66 can be reduced.

After the gas flow is created which lowers from the upper side in the processing chamber 53 and flows to a position outside the wafer W and higher than the wafer W, the support pins 57 are subsequently lowered to mount the wafer W on the heating plate 55. Heating of the wafer W is started as described above and performed for a predetermined time. The solvent generated by the heating is captured into the gas flow and exhausted via the exhaust ports 63 from the exhaust pipe 64 and the outlet pipe 66. The impurities generated together with the solvent from the wafer W and the like are collected by the impurity collecting portions 82, and the gas from which the impurities have been removed is sent, for example, to a plant exhaust system.

After the heating for the predetermined time is finished, the support pins 57 are raised again to lift the wafer W to a position above the heating plate 55. Subsequently, for example, the lid body 52 is raised to open the processing chamber 53. When the processing chamber 53 is opened, for example, the supply of the gas is stopped.

The wafer W on the support pins 57 is passed again to the main wafer transfer mechanism 21 entering through the transfer-in/out port 83 and transferred out of the thermal processing apparatus 50.

According to the first embodiment, the exhaust ports 63 are provided at positions in the peripheral side portion 52b of the lid body 52 higher than the wafer W, so that the gas introduced from the ceiling plate 52a of the lid body 52 flows toward the peripheral side portion 52b of the lid body 52. As a result of this, the gas is never directly blown to the front surface of the wafer W to prevent the volatilization of the solvent in the resist film on the front surface of the wafer W from being influenced by the movement of the gas flow in the heat processing. Accordingly, the outer peripheral portion of the wafer W is no longer adversely affected by the unstable gas flow, resulting in formation of a resist film with a uniform film thickness also at the outer peripheral portion of the wafer W.

Further, since the exhaust pipe 64 and the exhaust dispersion ring 77 are formed to be attachable and detachable to/from the lid body 52 and the exhaust pipe bodies 64a and the coupling pipe body 64b of the exhaust pipe 64 are formed to be disassembled, the lid body 52 can be detached from the exhaust pipe 64 for cleaning. The lid body 52 can also be detached from the apparatus main body and the exhaust pipe 64 and the exhaust dispersion ring 77 can be detached for cleaning. Accordingly, their maintenance is also easier than that in the prior art.

Second Embodiment

Figure 14:
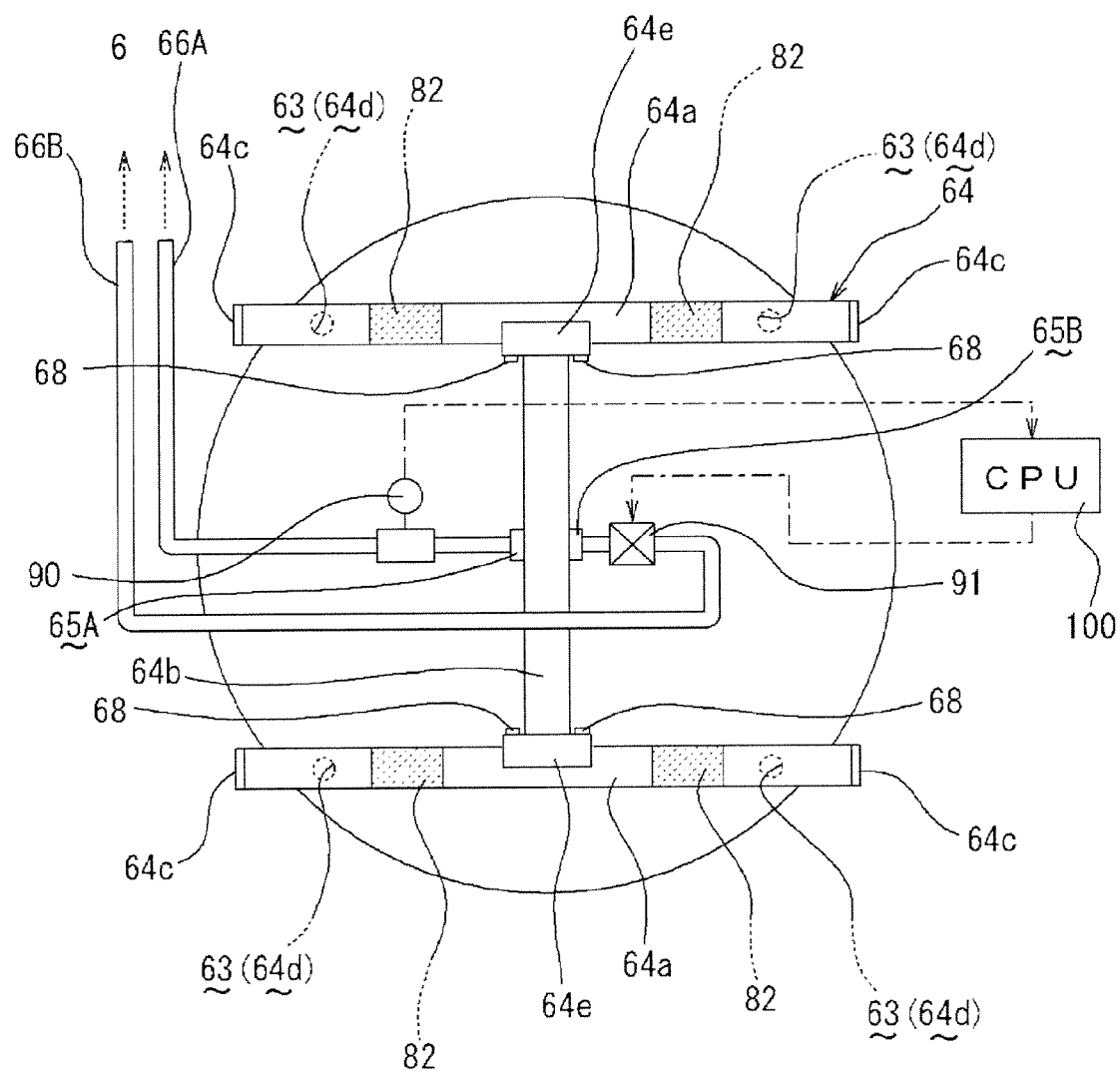
FIG. 14 is a plan view showing the principal part of a second embodiment of the present invention.

FIG. 14 is a schematic plan view of the principal part showing the thermal processing apparatus of a second embodiment.

The second embodiment is an embodiment to allow extension of the maintenance interval. More specifically, in the second embodiment, a first outlet 65A and a second outlet 65B are provided at the opposing side wall portions at an almost intermediate portion of the coupling pipe body 64b of the exhaust pipe 64, and corresponding first outlet pipe 66A and second outlet pipe 66B are connected to the first outlet 65A and the second outlet 65B, respectively as shown in FIG. 14. Further, a pressure sensor 90 being a clogging detection means for detecting clogging due to the impurities in the exhaust flowing through the first outlet pipe 66A is provided along the first outlet pipe 66A, and a switching valve 91 is provided along the second outlet pipe 66B. The pressure sensor 90 and the switching valve 91 are electrically connected to a control means, for example, a controller 100 such as a CPU (Central Processing Unit) and configured such that the switching valve 91 is opened/closed by a signal from the pressure sensor 90.

Note that the other portions in the second embodiment are the same as those in the first embodiment, and therefore the same numerals and symbols are given to the same portions to omit their description.

According to the second embodiment having the above characteristics, when the first outlet pipe 66A which is mainly used is clogged due to adherence of the impurities in the exhaust gas flow, the pressure sensor 90 detects the clogging, and its detection signal is transmitted to the controller 100, so that the switching valve 91 provided along the second outlet pipe 66B functioning as an auxiliary path can be opened based on a control signal from the controller 100 so as to exhaust the exhaust gas via the second outlet pipe 66B. Consequently, the maintenance cycle can be extended to be twice that of the first embodiment.

Third Embodiment

Figure 15:
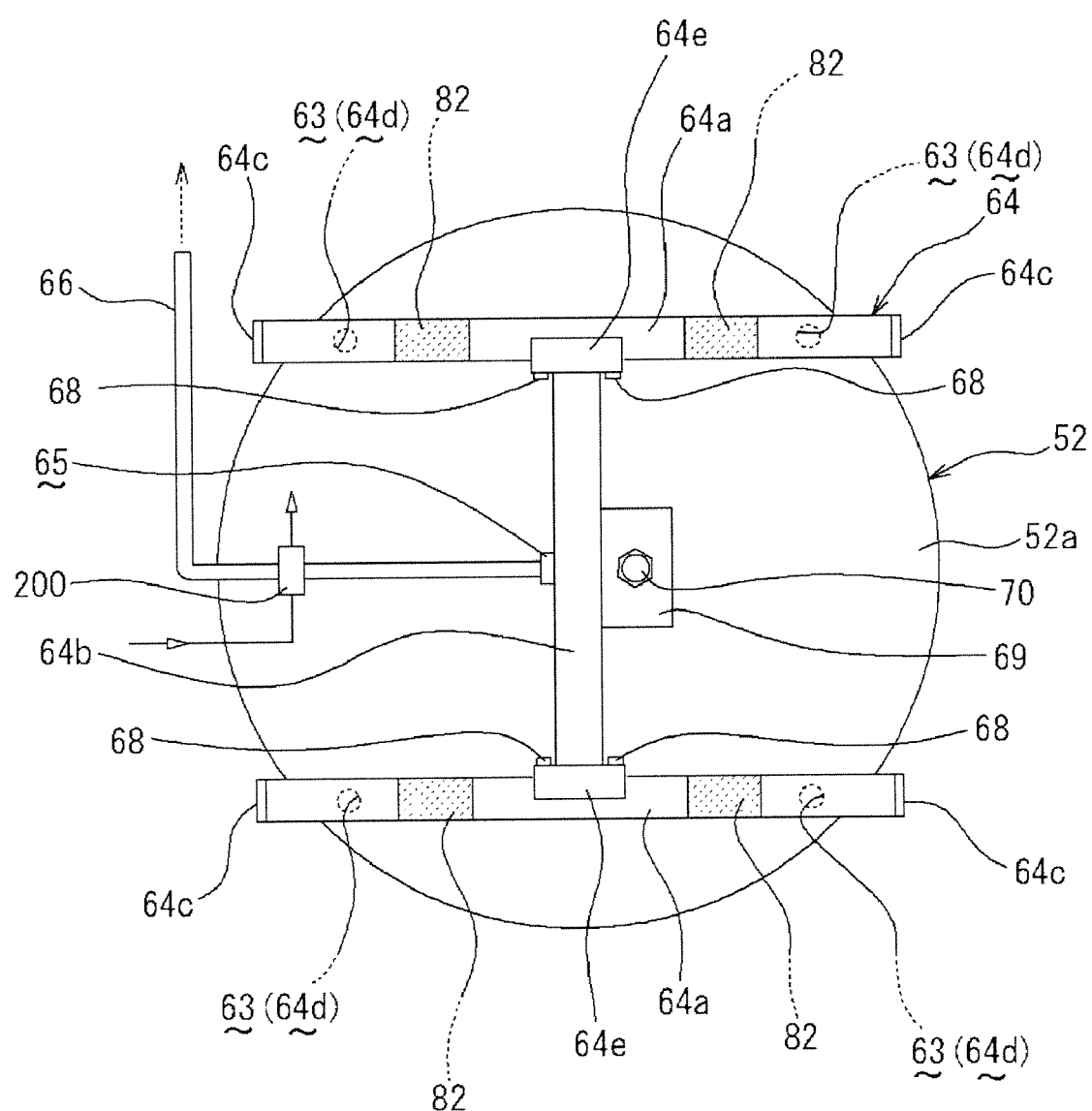
FIG. 15 is a plan view showing the principal part of a third embodiment of the present invention.

FIG. 15 is a schematic plan view of the principal part showing the thermal processing apparatus according to a third embodiment.

The third embodiment is an embodiment to improve the exhaust efficiency and prevent a reduction in flow rate due to adherence of the volatile component contained in the impurities in an exhaust fluid. More specifically, in the third embodiment, an ejector 200 being an exhauster is provided along the outlet pipe 66 at a position near the outlet 65 as shown in FIG. 15 in each of the multi-tiered thermal processing apparatuses 50. The ejector 87 provided at the dedicated hose 86 as shown in the previously illustrated FIG. 13 is not installed. The other portions are the same as those in the first embodiment, and therefore the same numerals and symbols are given to the same portions to omit their description.

According to the third embodiment having the above characteristics, drive of the ejector 200 can exhaust the gas supplied into the processing chamber 53 to the outlet pipe 66 via the exhaust path 76 of the exhaust dispersion ring 77, the exhaust ports 63 and the exhaust pipe 64. Further, the heat generated from the thermal processing apparatus 50 can be transferred to the ejector 200 to heat the temperature of the ejector 200 itself. Accordingly, the ejector 200 heated to a high temperature can prevent adherence of the volatile component in the impurities contained in the exhaust and remove the volatile component adhering thereto using the high temperature, thereby preventing a reduction in flow rate due to the adherence of the impurities. Consequently, according to the third embodiment, the exhaust efficiency can be further increased to improve the processing accuracy.

Fourth Embodiment

Figure 16A:
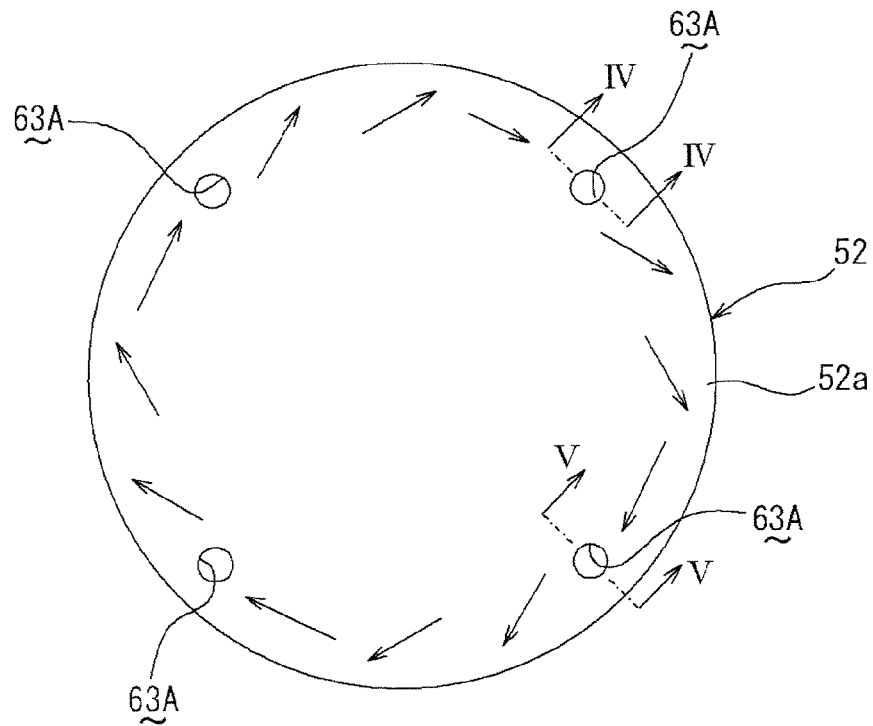
FIG. 16A is a plan view of the principal part of a fourth embodiment of the present invention.
Figure 16B:
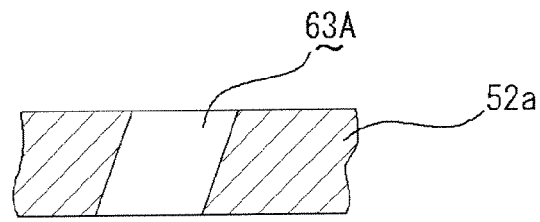
FIG. 16B is a cross-sectional view taken along a IV-IV line in FIG. 16A.
Figure 16C:
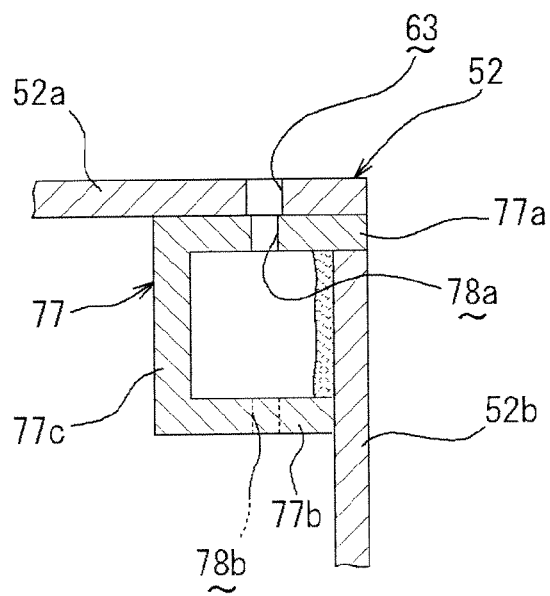
FIG. 16C is a cross-sectional view taken along a V-V line in FIG. 16A.

FIG. 16A is a schematic plan view of the principal part showing the thermal processing apparatus according to a fourth embodiment, FIG. 16B is an enlarged cross-sectional view taken along a IV-IV line in FIG. 16A, and FIG. 16C is an enlarged cross-sectional view taken along a V-V line in FIG. 16A.

The fourth embodiment is an embodiment to exhaust an exhaust fluid in the processing chamber in a swirl form to thereby cause the impurities in the exhaust fluid to adhere to the peripheral side portion 52b by the centrifugal force. More specifically, in the fourth embodiment, exhaust ports 63A provided in the lid body 52 are arranged and formed so that the exhaust flowing from the exhaust ports 63A to the exhaust pipe 64 flows in a spiral form as seen in plan view as shown in FIG. 16A. In other words, the exhaust ports 63A are arranged at the peripheral portion of the ceiling plate 52a at regular intervals, and the exhaust port 63A itself is formed to obliquely penetrate the ceiling plate 52a as shown in FIG. 16B.

Note that the other portions in the fourth embodiment are the same as those in the first embodiment, and therefore the same numerals and symbols are given to the same portions to omit their description.

According to the fourth embodiment having the above characteristics, the impurities in the exhaust fluid flowing from the inside of the processing chamber 53 to the exhaust ports 63A side are allowed to adhere to the inner surface of the peripheral side portion 52b of the lid body 52 (see FIG. 16C).

Figure 17:
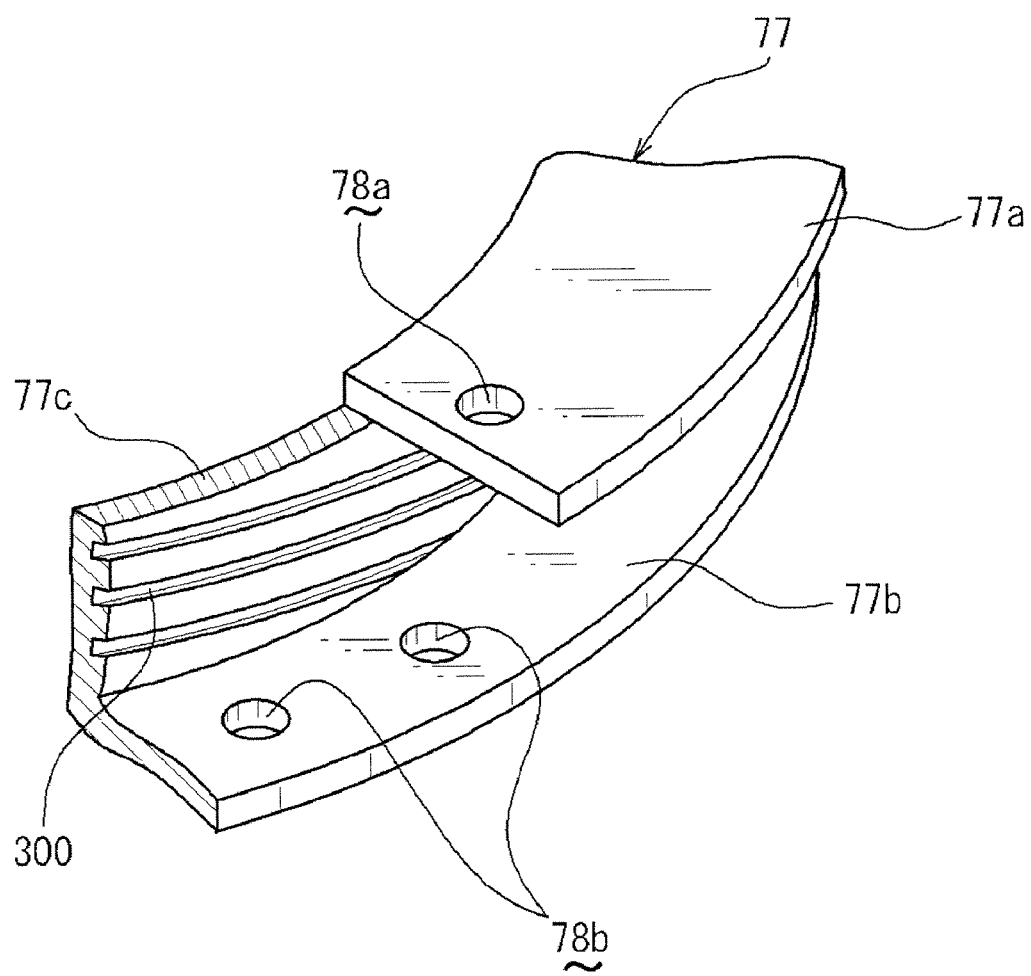
FIG. 17 is a perspective view of a cross section of the principal part of an exhaust dispersion ring showing another modified example of the fourth embodiment of the present invention.

Note that, in place of the above-described exhaust ports 63A, a spiral groove 300 may be formed in the surface of the vertical piece 77c of the exhaust dispersion ring 77 opposed to the peripheral side portion 52b as shown in FIG. 17. The formation of the spiral groove 300 in the surface of the vertical piece 77c of the exhaust dispersion ring 77 opposed to the peripheral side portion 52b as described above allows the exhaust flowing from the exhaust ports 63 to the exhaust pipe 64 to flow in a spiral form as seen in plan view. Also in this case, the impurities in the exhaust gas flowing from the inside of the processing chamber 53 to the exhaust ports 63 side are allowed to adhere to the inner surface of the peripheral side portion 52b of the lid body 52.

While the case in which the thermal processing apparatus according to the present invention is applied to the heat processing apparatus in the resist coating and developing treatment system for the semiconductor wafer has been described in the above-described embodiments, the thermal processing apparatus is, of course, applicable to a heat processing apparatus in a resist coating and developing treatment system for an LCD glass substrate.

What is claimed is:

1. A thermal processing apparatus for thermally processing a substrate in a processing chamber, comprising:
    a thermal processing plate for mounting and thermally processing the substrate thereon; and
    a lid body covering said thermal processing plate from above to constitute a portion of the processing chamber,
    wherein said lid body comprises an upper surface portion and a peripheral side portion vertically provided at a peripheral end portion of the upper surface portion,
    wherein the upper surface portion of said lid body is provided with a supply port for supplying a gas into the processing chamber, and an outer peripheral portion of the upper surface portion of said lid body is provided with a plurality of exhaust ports for exhausting the gas from the processing chamber, and
    wherein an exhaust pipe communicating with the exhaust ports and having an outlet at a point at equal distances in length of flow paths from the exhaust ports is provided to be attachable and detachable to/from an outer upper surface of said lid body.

2. The thermal processing apparatus as set forth in claim 1, wherein an exhaust dispersion ring constituting an exhaust path in cooperation with the peripheral side portion and having a plurality of air holes is provided on the inner side of the peripheral side portion of said lid body in a manner to be attachable and detachable to/from said lid body.

3. The thermal processing apparatus as set forth in claim 2, wherein said exhaust dispersion ring comprises an upper piece and a lower piece vertically opposed to each other and has a cross section in a channel shape,
    wherein the upper piece and the lower piece are formed with a plurality of air holes respectively at positions not aligned with each other in the vertical direction, and
    wherein an aperture ratio of the air holes in the lower piece is greater than an aperture ratio of the air holes in the upper piece.

4. The thermal processing apparatus as set forth in claim 2, wherein a spiral groove is formed in a surface of said exhaust dispersion ring opposed to the peripheral side portion.

5. The thermal processing apparatus as set forth in claim 1, wherein the upper surface portion of said lid body is provided with four exhaust ports at regular intervals,
    wherein said exhaust pipe comprises two exhaust pipe bodies each of which communicates with the exhaust ports at two positions via sealing members respectively, and a coupling pipe body allowing respective middle portions of the two exhaust pipe bodies to communicate with each other, and
    wherein a middle portion of said coupling pipe body is provided with an outlet.

6. The thermal processing apparatus as set forth in claim 5, wherein said coupling pipe body is attachable and detachable to/from said exhaust pipe bodies.

7. The thermal processing apparatus as set forth in claim 1, wherein a dispersion nozzle is provided on a lower surface of said lid body, said dispersion nozzle having radial flow paths for dividing the gas to be supplied into the processing chamber via the supply port in radial directions.

8. The thermal processing apparatus as set forth in claim 1, wherein a coating film made of a synthetic resin, which a volatile component hardly adheres to and easily peels off even if the component adheres thereto, is formed on an inner side surface of said exhaust pipe.

9. The thermal processing apparatus as set forth in claim 1, wherein an impurity collecting portion is provided in said exhaust pipe.

10. The thermal processing apparatus as set forth in claim 1, wherein said exhaust pipe is provided with two outlets, and a sensor for detecting clogging with an exhaust fluid is provided along one of exhaust paths connected to the outlets, and a valve opening/closing based on a signal from said sensor is provided along the other exhaust path.

11. The thermal processing apparatus as set forth in claim 1, wherein an ejector is provided along an outlet pipe connected to the outlet of said exhaust pipe at a position near the outlet.

12. The thermal processing apparatus as set forth in claim 1, wherein the exhaust ports provided in said lid body are arranged and formed so that the exhaust flowing from the exhaust ports to said exhaust pipe flows in a spiral form as seen in plan view.

13. A thermal processing apparatus for thermally processing a substrate in a processing chamber, comprising:
    a thermal processing plate for mounting and thermally processing the substrate thereon; and
    a lid body covering said thermal processing plate from above to constitute a portion of the processing chamber,
    wherein said lid body comprises an upper surface portion and a peripheral side portion vertically provided at a peripheral end portion of the upper surface portion,
    wherein the upper surface portion of said lid body is provided with a supply port for supplying a gas into the processing chamber, and a side portion of the upper surface portion of said lid body is provided with a plurality of exhaust ports for exhausting the gas from the processing chamber,
    wherein an exhaust pipe communicating with the exhaust ports and having an outlet at a point at equal distances from the exhaust ports is provided to be attachable and detachable to/from said lid body, and
    wherein an attachment member having an attachment hole is provided projecting in a horizontal direction at a central portion of said exhaust pipe, and a fixing member penetrating through the attachment hole is fixed to an attachment receiving portion provided on the upper surface portion of said lid body to be attachable and detachable.

14. The thermal processing apparatus as set forth in claim 13, wherein an exhaust dispersion ring constituting an exhaust path in cooperation with the peripheral side portion and having a plurality of air holes is provided on the inner side of the peripheral side portion of said lid body in a manner to be attachable and detachable to/from said lid body.

15. The thermal processing apparatus as set forth in claim 14, wherein said exhaust dispersion ring comprises an upper piece and a lower piece vertically opposed to each other and has a cross section in a channel shape, wherein the upper piece and the lower piece are formed with a plurality of air holes respectively at positions not aligned with each other in the vertical direction, and wherein an aperture ratio of the air holes in the lower piece is greater than an aperture ratio of the air holes in the upper piece.

16. The thermal processing apparatus as set forth in claim 14, wherein a spiral groove is formed in a surface of said exhaust dispersion ring opposed to the peripheral side portion.

17. The thermal processing apparatus as set forth in claim 13, wherein the upper surface portion of said lid body is provided with four exhaust ports at regular intervals, wherein said exhaust pipe comprises two exhaust pipe bodies each of which communicates with the exhaust ports at two positions via sealing members respectively, and a coupling pipe body allowing the two exhaust pipe bodies to communicate with each other, and wherein said coupling pipe body is provided with an outlet.

18. The thermal processing apparatus as set forth in claim 13, wherein the exhaust ports provided in said lid body are arranged and formed so that the exhaust flowing from the exhaust ports to said exhaust pipe flows in a spiral form as seen in plan view.

19. A thermal processing apparatus for thermally processing a substrate in a processing chamber, comprising:

a thermal processing plate for mounting and thermally processing the substrate thereon; and a lid body covering said thermal processing plate from above to constitute a portion of the processing chamber, wherein said lid body comprises an upper surface portion and a peripheral side portion vertically provided at a peripheral end portion of the upper surface portion, wherein the upper surface portion of said lid body is provided with a supply port for supplying a gas into the processing chamber, and a side portion of the upper surface portion of said lid body is provided with a plurality of exhaust ports for exhausting the gas from the processing chamber, wherein an exhaust pipe communicating with the exhaust ports and having an outlet at a point at equal distances from the exhaust ports is provided to be attachable and detachable to/from said lid body, and wherein an inner tube made of a synthetic resin, which a volatile component hardly adheres to and easily peels off even if the component adheres thereto, is inserted in said exhaust pipe.

20. The thermal processing apparatus as set forth in claim 19, wherein an exhaust dispersion ring constituting an exhaust path in cooperation with the peripheral side portion and having a plurality of air holes is provided on the inner side of the peripheral side portion of said lid body in a manner to be attachable and detachable to/from said lid body.

21. The thermal processing apparatus as set forth in claim 20, wherein said exhaust dispersion ring comprises an upper piece and a lower piece vertically opposed to each other and has a cross section in a channel shape, wherein the upper piece and the lower piece are formed with a plurality of air holes respectively at positions not aligned with each other in the vertical direction, and wherein an aperture ratio of the air holes in the lower piece is greater than an aperture ratio of the air holes in the upper piece.

22. The thermal processing apparatus as set forth in claim 20, wherein a spiral groove is formed in a surface of said exhaust dispersion ring opposed to the peripheral side portion.

23. The thermal processing apparatus as set forth in claim 19, wherein the upper surface portion of said lid body is provided with four exhaust ports at regular intervals, wherein said exhaust pipe comprises two exhaust pipe bodies each of which communicates with the exhaust ports at two positions via sealing members respectively, and a coupling pipe body allowing the two exhaust pipe bodies to communicate with each other, and wherein said coupling pipe body is provided with an outlet.

24. The thermal processing apparatus as set forth in claim 19, wherein the exhaust ports provided in said lid body are arranged and formed so that the exhaust flowing from the exhaust ports to said exhaust pipe flows in a spiral form as seen in plan view.

* * * * *